(12) United States Patent
Votava et al.

(10) Patent No.: US 10,950,745 B2
(45) Date of Patent: Mar. 16, 2021

(54) MANUFACTURING SYSTEMS AND METHODS INCLUDING INLINE CUTTING

(71) Applicant: 3M INNOVATIVE PROPERTIES COMPANY, St. Paul, MN (US)

(72) Inventors: Mark J. Votava, Stillwater, MN (US); Jiaying Ma, Cottage Grovee, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 171 days.

(21) Appl. No.: 16/321,773

(22) PCT Filed: Jul. 31, 2017

(86) PCT No.: PCT/US2017/044583
§ 371 (c)(1),
(2) Date: Jan. 29, 2019

(87) PCT Pub. No.: WO2018/026679
PCT Pub. Date: Feb. 8, 2018

(65) Prior Publication Data
US 2020/0381576 A1    Dec. 3, 2020

Related U.S. Application Data

(60) Provisional application No. 62/369,929, filed on Aug. 2, 2016.

(51) Int. Cl.
*G09F 3/00*     (2006.01)
*H01L 31/18*    (2006.01)
(Continued)

(52) U.S. Cl.
CPC ......... *H01L 31/188* (2013.01); *B65H 23/032* (2013.01); *B65H 35/0013* (2013.01); *B65H 35/02* (2013.01)

(58) Field of Classification Search
CPC . H01L 31/188; B65H 23/032; B65H 35/0013; B65H 35/02
See application file for complete search history.

(56) References Cited

U.S. PATENT DOCUMENTS 4,235,643 A   11/1980   Amick
4,246,042 A    1/1981   Knasel
(Continued)

FOREIGN PATENT DOCUMENTS

CN    203401228 U    1/2014
CN    105680782 A    6/2016
(Continued)

OTHER PUBLICATIONS

Supplementary Search Report for EP Appl. No. 17837456.7, dated Jan. 31, 2020, 5 pp.
(Continued)

*Primary Examiner* — Vishal I Patel
(74) *Attorney, Agent, or Firm* — Gregg H. Rosenblatt

(57) ABSTRACT

An automated photovoltaic (PV) subassembly manufacturing method involves in-line cutting of material strips. A tape is cut longitudinally into multiple strips. The strips are separated and guided into spaced apart positions relative to a surface of the PV cell subassembly comprising one or more PV cells. The multiple strips remain attached to the tape while the strips are guided to the spaced apart positions. The multiple strips are positioned at attachment locations on the surface of a PV cell subassembly.

8 Claims, 9 Drawing Sheets

(51) Int. Cl.
   *B65H 35/00*   (2006.01)
   *B65H 23/032*  (2006.01)
   *B65H 35/02*   (2006.01)

(56) References Cited

U.S. PATENT DOCUMENTS

| | | | |
|---|---|---|---|
| 4,576,850 | A | 3/1986 | Martens |
| 5,320,684 | A | 6/1994 | Amick |
| 5,994,641 | A | 11/1999 | Kardauskas |
| 6,394,330 | B1 * | 5/2002 | Jackson ................ B65H 35/02 |
| | | | 225/2 |
| 2006/0081321 | A1 | 4/2006 | Bradshaw et al. |
| 2006/0107991 | A1 | 5/2006 | Baba |
| 2010/0200046 | A1 | 8/2010 | Sauar |
| 2010/0330726 | A1 | 12/2010 | Gonsiorawski |
| 2012/0003448 | A1 * | 1/2012 | Weigel ..................... B32B 7/02 |
| | | | 428/212 |
| 2012/0043007 | A1 | 2/2012 | Malik, Jr. |
| 2014/0060615 | A1 | 3/2014 | Gretler et al. |
| 2015/0155411 | A1 | 6/2015 | Chen |
| 2016/0056308 | A1 * | 2/2016 | Rotto ................... H01L 31/0504 |
| | | | 136/244 |

FOREIGN PATENT DOCUMENTS

| | | |
|---|---|---|
| WO | WO 2013/148149 | 10/2013 |
| WO | WO 2017-027769 | 2/2017 |

OTHER PUBLICATIONS

Search Report for CN Appl. No. 201780048443.X, dated Jul. 31, 2019, 2 pp.

International Search Report for PCT International Application No. PCT/US2017/044583, dated Oct. 12, 2017, 2 pages.

* cited by examiner

MANUFACTURING SYSTEMS AND METHODS INCLUDING INLINE CUTTING

TECHNICAL FIELD

This disclosure relates generally to systems and methods for manufacturing photovoltaic cell subassemblies.

BACKGROUND

One of the promising energy resources today is sunlight. Globally, millions of households currently obtain power from solar photovoltaic systems. The rising demand for solar power has been accompanied by a rising demand for devices and materials capable of fulfilling the requirements for these applications. Converting sunlight to electrical power may be accomplished by the use of photovoltaic cells (PV cells). Photovoltaic cells are relatively small in size and typically are combined into a physically integrated PV cell module having a greater power output. Photovoltaic cell modules are generally formed from two or more "strings" of PV cells, comprising a plurality of PV cells arranged in a row and electrically connected in series using tinned flat copper wires which may also be referred to as electrical connections, tabbing ribbons, bus bars or bus wires.

Photovoltaic cell modules typically comprise one or more PV cells surrounded by an encapsulant, on both sides of the PV cells. Two panels of glass (or a suitable polymeric material) are positioned adjacent and bonded to the front-side and backside of the encapsulant. The two panels are transparent to solar radiation and are typically referred to as front-side layer and backside layer, or backsheet. The front-side layer and the backsheet may be made of the same material or different materials. The encapsulant is a light transparent polymer material that encapsulates the PV cells and also is bonded to the front-side layer and backsheet so as to physically seal off the cells. This laminated construction provides mechanical support for the cells and also protects them against damage due to environmental factors such as wind, snow, and ice.

The PV cell module may be fit into a metal frame, with a sealant covering the edges of the module engaged by the metal frame. The metal frame protects the edges of the module, provides additional mechanical strength, and facilitates combining it with other modules so as to form a larger array or solar panel that can be mounted to a suitable support that holds the modules at the proper angle to maximize reception of solar radiation.

BRIEF SUMMARY

Some embodiments are directed to an automated photovoltaic (PV) subassembly manufacturing method. A tape is cut longitudinally into multiple strips. The strips are separated and guided into spaced apart positions relative to a surface of the PV cell subassembly comprising one or more PV cells. The multiple strips remain attached to the tape while the strips are guided to the spaced apart positions. The multiple strips are positioned at attachment locations on the surface of the PV cell subassembly.

Some embodiments involve an automated photovoltaic (PV) cell subassembly manufacturing system. An input spindle holds an input roll of tape. A tape cutting mechanism longitudinally cuts the tape into multiple strips. One or more guides separate and guide the multiple strips into spaced apart positions for placement on the PV cell subassembly at attachment locations. The system is configured such that the multiple strips remain attached to the tape while the strips are guided to the spaced apart positions.

According to some aspects, each strip is guided to its spaced apart position with precision of about 0.1 mm to about 0.2 mm.

Some embodiments involve an automated manufacturing method. A tape is cut longitudinally into multiple strips. The strips are separated and guided into spaced apart positions relative to a surface of a substrate. The multiple strips remain attached to the tape while the strips are guided to the spaced apart positions. The multiple strips are positioned at attachment locations on the surface of the substrate.

An automated manufacturing system include an input spindle configured to hold an input roll of tape. A tape cutting mechanism cuts the tape longitudinally into multiple strips. One or more guides separate and guide the multiple strips into spaced apart positions for placement at attachment locations on a surface of substrate. The multiple strips remain attached to the tape while the strips are guided to the spaced apart positions.

These and other aspects of the present application will be apparent from the detailed description below. In no event, however, should the above summaries be construed as limitations on the claimed subject matter, which subject matter is defined solely by the attached claims.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DESCRIPTION OF ILLUSTRATIVE EMBODIMENTS

Embodiments disclosed herein involve systems and methods for manufacturing PV cells subassemblies, e.g., individual PV cells or PV cell modules. The disclosed systems and methods involve cutting and positioning of narrow strips of material on the surfaces of a substrate, e.g., PV cells and/or PV cell subassemblies. In some implementations, the narrow strips are positioned for attachment to surfaces of PV cells and/or between PV cells an/or at the edges of a PV cell module. The narrow strips include but are not limited to current collection bus bars that extend across the front and/or back side surfaces of the PV cells, tabbing ribbons that extend across the front and/or back side surfaces of PV cells and between PV cells to interconnect the PV cells in a module, and/or light redirecting films (LRF) that extend over various locations of the PV cell subassembly to enhance light absorption of the PV cells. A PV cell subassembly may include an individual PV cell or a PV cell module, for example.

Figure 1A:
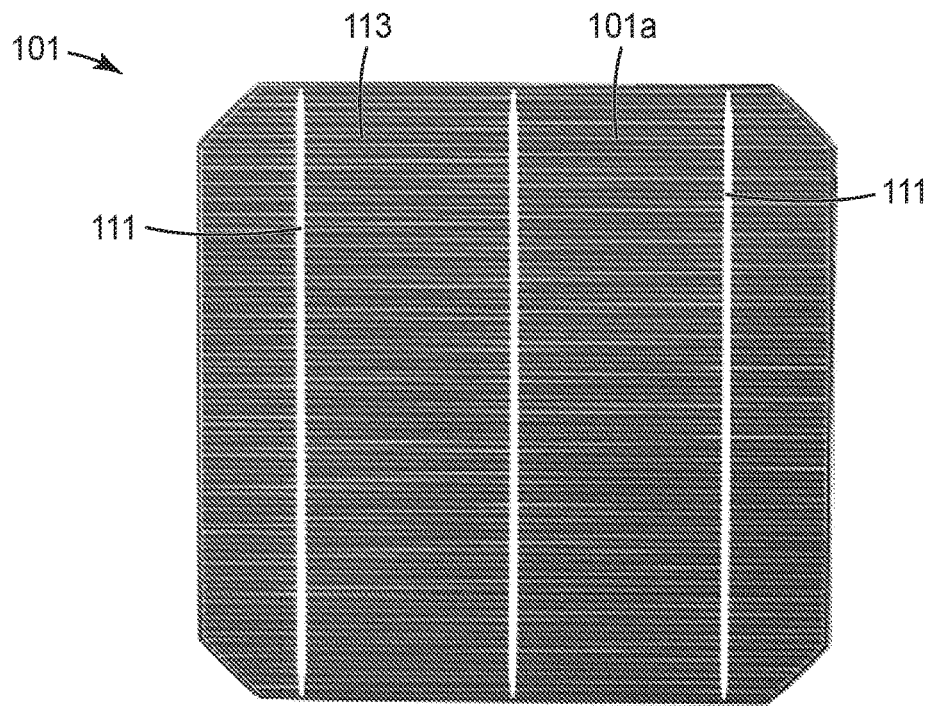
FIGS. 1A and 1B respectively show photographs of the front and back sides of a PV cell.
Figure 1B:
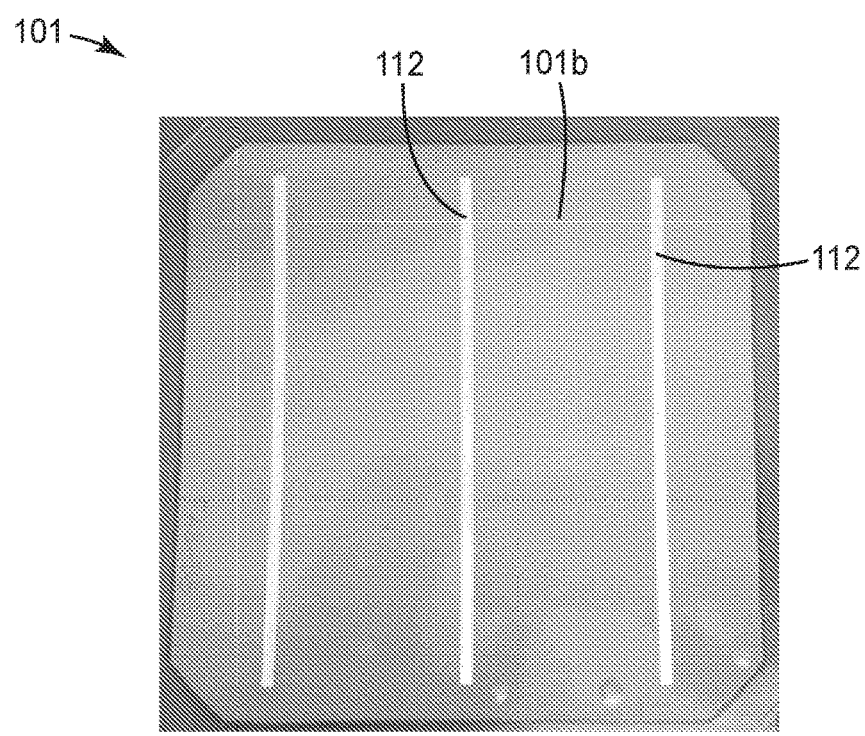
Figure 1C:
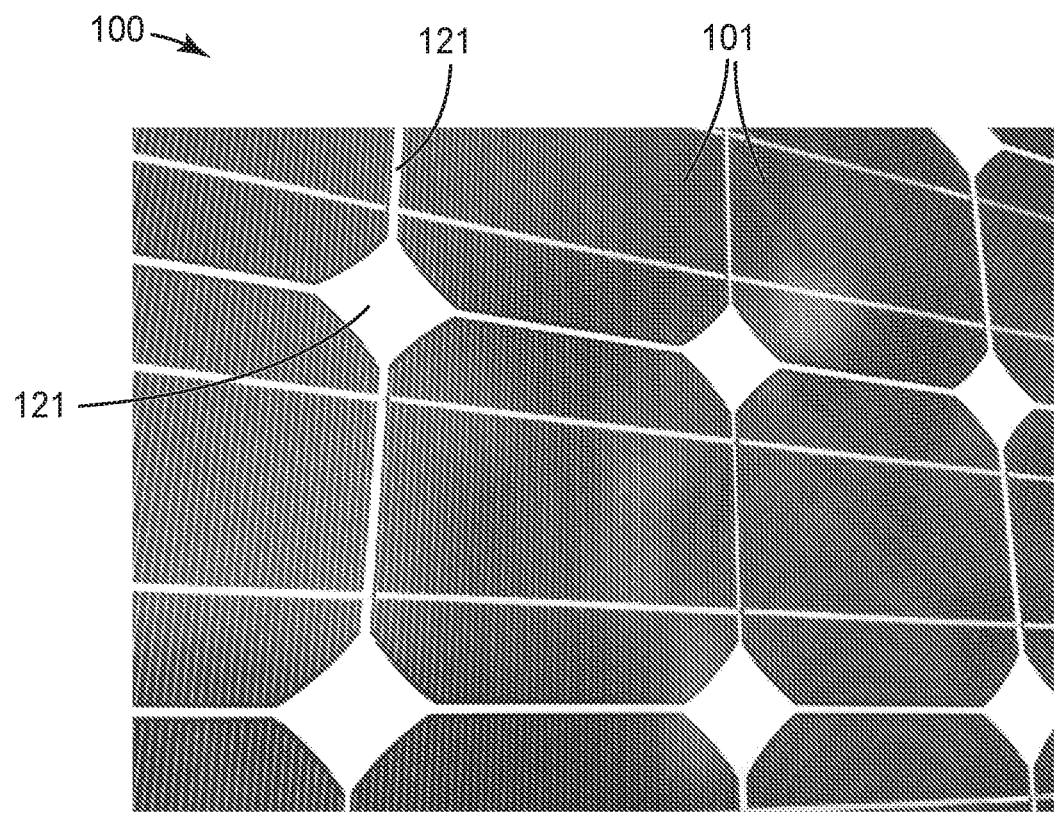
FIG. 1C is a photograph that shows a portion of a PV cell module comprising multiple PV cells.
Figure 2A:
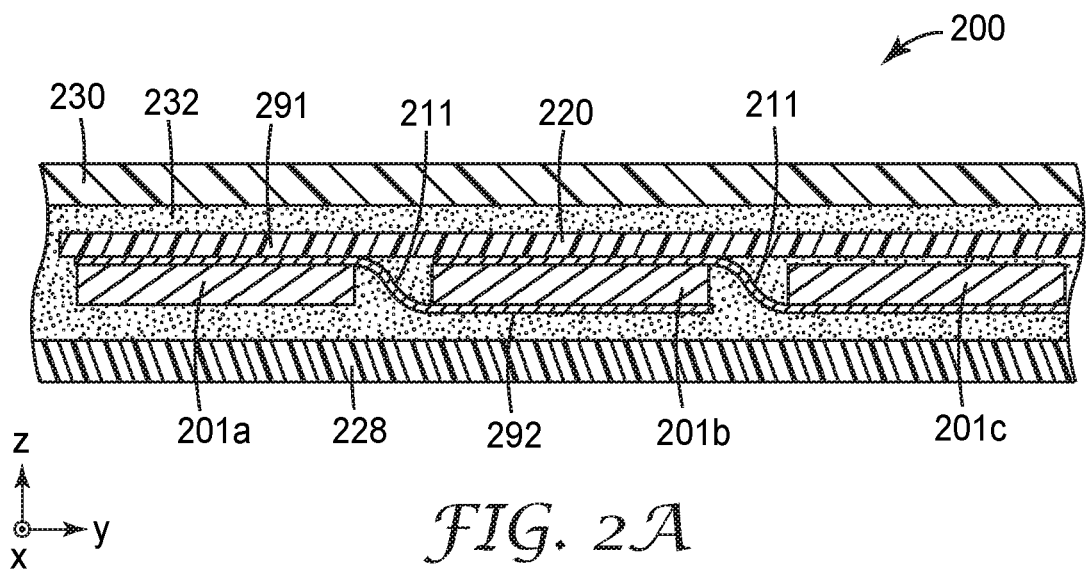
FIG. 2A is a cross sectional drawing of a interconnected PV cells of a portion of a PV cell module in accordance with some embodiments.

FIGS. 1A and 1B respectively show photographs of the front 101a and back 101b sides of a PV cell 101; FIG. 1C is a photograph that shows a portion of a PV cell module 100 comprising multiple PV cells 101; and FIG. 2A is a cross sectional drawing of a interconnected PV cells 201a-c of a portion of a PV cell module 200 in accordance with some embodiments.

As illustrated in FIGS. 1A and 1B, PV cells 101 may include current collection bus bars 111 on the front, light absorption, side 101a of the PV cells 101 and may also include bus bars 112 on the back side 101b of the cells 101. Finger electrodes 113 extend across the front of the PV cell 101 and are electrically connected to the bus bars 111 and/or to tabbing ribbons that connect PV cells. In some configurations, the front and/or back side bus bars and/or finger electrodes may be screen printed or otherwise deposited on the PV cell surfaces 101a, 101b. In some configurations, the front and/or back side bus bars may comprise strips of metal, such as copper or aluminum strips that are less than 3 mm, less than 2 mm, less than 1.5 mm, or even less than 1 mm in width. The strips may be attached by adhesive and/or solder to the PV cells. As best seen in the cross sectional diagram of FIG. 2A, PV cells 201a-c in a module 200 connected in series may include electrically conductive tabbing ribbons 211 that extend from the front side 291 of one cell 201a to the back side 292 of an adjacent cell 201b.

With reference to FIGS. 1A through 1C, on the front sides 101a of the PV cells 101, the bus bars 111 and/or tabbing ribbons result in inactive shaded areas that reduce the active surface area available for absorption of incident light. Therefore, the amount of current that is produced by the PV cell 101 is correspondingly reduced by the presence of front side bus bars 111 and/or tabbing ribbons. Similarly, blank areas 121 between PV cells 101 arranged in a PV cell module 100 do not contribute to light absorption or current production of the module 100.

Figure 2B:
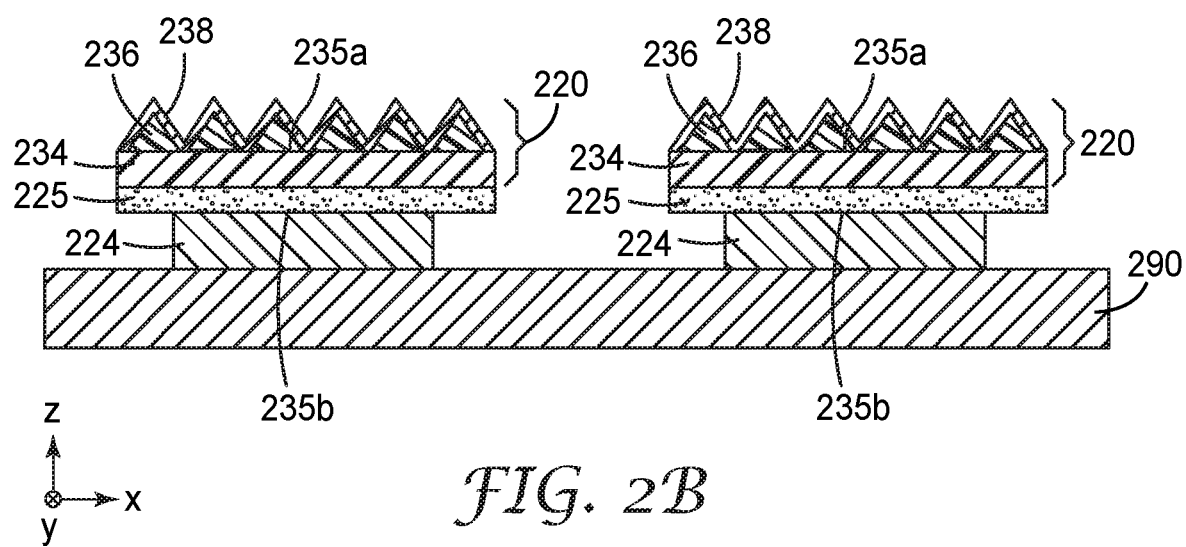
FIG. 2B is a cross sectional view of a portion of a PV cell subassembly comprising a PV cell having bus bars with light redirecting film (LRF) disposed on the bus bars in accordance with some embodiments.

According to some embodiments, a light redirecting film (LRF) may be placed on the bus bars, tabbing ribbons of PV cells and/or blank areas of modules, and/or other inactive shaded regions of the PV cells or PV cell modules. The LRF redirects the light toward the active region of the PV cell or PV cell module. In this way, the total power of the PV cell or PV cell module can be increased. FIG. 2A shows a PV cell module 200 with LRF 220 disposed over the tabbing ribbons 211 on the front side 201a of the PV cells in a PV cell module. FIG. 2B is a cross sectional view of a portion of a PV cell subassembly 290 comprising a PV cell 291 having bus bars 224 with LRF 220 disposed on the bus bars 224.

As shown in FIG. 2A, the PV cell module 200 may include a back protector member, often in the form of backsheet 228. In some embodiments, backsheet 228 is an electrically insulating material such as glass, a polymeric layer, a polymeric layer reinforced with reinforcing fibers (e.g., glass, ceramic or polymeric fibers), or a wood particle board. In some embodiments, backsheet 228 includes a type of glass or quartz. In some embodiments, the glass is thermally tempered. Some exemplary glass materials include soda-lime-silica based glass. In other embodiments, backsheet 228 is a polymeric film. Exemplary backsheets include multilayer polymer films. One commercially available example of a backsheet is the 3M™ Scotchshield™ film commercially available from 3M Company, Saint Paul, Minn. Exemplary backsheets are those that include extruded PTFE. The backsheet may be connected to a building material, such as a roofing membrane (for example, in building integrated photovoltaics (BIPV))

Overlying PV cells 201a-c, is a generally planar light transmitting and electrically non-conducting front-side layer 230, which also provides support to the PV cells 201. In some embodiments, front side layer 230 includes a type of glass or quartz. In some embodiments, the glass is thermally tempered. Some exemplary glass materials include soda-lime-silica based glass. In some embodiments, the front-side layer has a low iron content (e.g., less than about 0.10% total iron, more preferably less than about 0.08, 0.07 or 0.06% total iron) and/or an antireflection coating thereon to optimize light transmission. In other embodiments, the front-side layer is a barrier layer.

In some embodiments, an encapsulant 232 is interposed between backsheet 228 and the front-side layer 230, surrounding cells 201a-c, and tabbing ribbons 211. For example, the encapsulant 232 may comprise a suitable light-transparent, electrically non-conducting material. In one embodiment, encapsulant 232 is an ethylene vinyl acetate copolymer (EVA), or an ionomer. In one exemplary method, the encapsulant 232 is provided in the form of discrete sheets that are positioned below and/or on top of the array of PV cells 201, with those components in turn being sandwiched between the backsheet 228 and the front side layer 230. Subsequently the laminate construction is heated under vacuum, causing the encapsulant sheets to become liquified enough to flow around and encapsulate the PV cells 201 while simultaneously filling any voids in the space between the front side layer 230 and backsheet 228. Upon cooling, the liquified encapsulant solidifies. In some embodiments, the encapsulant may be additionally cured in situ to form a transparent solid matrix. The encapsulant adheres to the front side layer 230 and backsheet 228 to form a laminated subassembly. Suitable encapsulants and other materials, components, and/or configurations for PV cells and/or PV cell modules are described in commonly owned U.S. Patent Application Publication 2015/0155411 which is incorporated herein by reference in its entirety.

As discussed in connection with FIGS. 2A and 2B, PV cell bus bars, tabbing ribbons, and LRF are thin strips of material that may be disposed on the surfaces of the PV cell. As shown in FIG. 2A, a first PV cell 201a is electrically connected to a second cell 201b by tabbing ribbon 211. In the specific embodiment shown in FIG. 2A, the interconnected PV cells 201a,b are directly adjacent to one another, but cells that are not directly adjacent fall within the scope of the present disclosure. In the specific embodiment shown in FIG. 2A, tabbing ribbon 211 extends across the entire length of and over the first cell 201a, extending beyond the edge of the first cell 201a and bending down and under the second cell 201b. Tabbing ribbon 211 then extends across the entire length of and underneath second cell 201b. The LRF 220 is positioned adjacent to the tabbing ribbon 211 on the light receiving side of the module 200. In one embodiment, the LRF film 220 is provided in the form of a continuous strip of flexible polymeric film, which is placed over the entire length of the module 200. In another embodiment, discrete, discontinuous sections of LRF are provided over each PV cell.

FIG. 2B provides a cross sectional view of an embodiment of a portion of a PV cell subassembly 290 in accordance with some embodiments. The PV cell subassembly 290 includes a PV cell 291 with two or more bus bars 224 that extend across the length of the PV cell 291. Finger electrodes are fine contacts that extend across the surface of the PV cell between the PV cell bus bars 224 and are electrically connected to the bus bars and/or tabbing ribbons. Finger contacts are not visible in FIG. 2B, but may be observed in FIG. 1A. As discussed above, tabbing ribbons may be used to interconnect PV cells in a module. Although not shown in FIG. 2B, the tabbing ribbons may extend fully or partially over the bus bars 224, e.g., between the bus bars 224 and the LRF 220. In various embodiments, the tabbing ribbons and/or bus bars may be less than about 4 mm, less than about 3 mm, less than about 2 mm, or even less than about 1 mm wide. In some embodiments, the bus bars 224 and/or tabbing ribbons 211 may be disposed over a portion of the length or over substantially the entire length of the PV cell, which is along the y direction indicated in FIGS. 2A and 2B. The LRF 220 may be disposed over one or more of the bus bars 224 and/or tabbing ribbons 211. In some embodiments, the LRF completely overlaps with bus bars and/or tabbing ribbons in order to maximize efficiency of the PV cell. In an alternative embodiment, LRF does not completely overlap bus bars and/or tabbing ribbons. In some embodiments, the LRF is provided in the form of strips which are slightly wider than the bus bars or tabbing ribbons. FIG. 2B shows the LRF 220 overlapping and extending beyond bus bars 224 along the width direction (x direction in FIG. 2B). In some embodiments, the width of each bus bar or tabbing ribbon may be about 1.5 mm and the width of each LRF is about 1.5 mm. In some embodiments, the width of the LRF ranges from about 0.7 mm to about 3.0 mm.

Any type of LRF may be used in the present application including, but not limited to, those described in U.S. Pat. No. 5,994,641 (Kardauskas), U.S. Pat. No. 4,235,643 (Amick), U.S. Pat. No. 5,320,684 (Amick et al), U.S. Pat. No. 4,246,042 (Knasel et al), and U.S. Publication Nos. 2006/0107991 (Baba), and 2010/0200046 (Sauar et al), and 2010/0330726 (Gonsiorawski), the disclosure of each of which is incorporated herein in its entirety. One exemplary LRF is a multilayer construction, as shown in FIG. 2B. Light redirecting film 220 comprises a flexible polymeric layer 234 having a first generally flat major surface 235a and a second generally flat major surface 235b. Structured surface 236 is adjacent to the first major surface 235a of the flexible polymeric layer 234. In some embodiments, the flexible polymeric layer 234 is one of a polyolefin (e.g., polyethylene, polypropylene), polyester (e.g., polyethylene terephthalate (PET)), and polyacrylate (e.g., polymethyl(meth)acrylate (PMMA)). In some embodiments, the structured surface 236 is made of one of a thermoplastic polymer and a polymerizable resin. In some embodiments, the structured surface further comprises a reflective coating 238, such as, a metalized layer (e.g., aluminum, silver).

Polymerizable resins suitable for forming structured surfaces include blends of photoinitiator and at least one compound bearing an acrylate group. Preferably, the resin blend contains a monofunctional, a difunctional, or a polyfunctional compound to ensure formation of a crosslinked polymeric network upon irradiation. Illustrative examples of resins that are capable of being polymerized by a free radical mechanism that can be used herein include acrylic-based resins derived from epoxies, polyesters, polyethers, and urethanes, ethylenically unsaturated compounds, isocyanate derivatives having at least one pendant acrylate group, epoxy resins other than acrylated epoxies, and mixtures and combinations thereof. The term "acrylate" is used herein to encompass both acrylates and methacrylates. U.S. Pat. No. 4,576,850 (Martens) (incorporated herein in its entirety) discloses examples of crosslinked resins that may be used in forming the structured surface of LRF. In some embodiments, the resin is a non-halogenated resin. Some benefits of use of non-halogenated resins include the fact that they are more environmentally friendly and do not corrode metals.

Some embodiments of the LRF include a reflective coating. In some embodiments, the reflective coating is a mirror coating. A reflective or mirror coating can provide reflectivity of incident sunlight and thus can block incident sunlight from being incident on the polymer materials (which can degrade due to UV exposure). Any desired reflective coating or mirror coating thickness can be used. Some exemplary thicknesses are measured by optical density or percent transmission. Obviously, thicker coatings block more UV light. However, coatings that are too thick may cause increased stress within the coating, resulting in coating cracking. Additionally, thicker coatings are often less durable when exposed to damp heat testing and/or pressure cooker testing. An LRF may have a reflective or mirror coating thickness of between about 35 nm to about 60 nm, for example.

During the lamination process of the PV cell module, it may be important to maintain registration between the bus bars and/or tabbing ribbons and LRF strips. In one exemplary method of making a PV cell module, the LRF strips attached to the bus bars and/or tabbing ribbons with an adhesive 225 such as a thermally activated or pressure sensitive adhesive. In some embodiments, the thermally activated adhesive is ethylene vinyl acetate polymer (EVA). Other types of suitable thermally activated adhesives include polyolefins. The LRF films are positioned over the PV cell or PV cell module and heat is applied thereto to melt the thermally activated adhesive, effectively bonding the LRF strips to the bus bars, tabbing ribbons, or other inactive regions. In some embodiments, other layers may be laminated or coated onto the PV module (e.g., backsheets, encapsulants, front-side layers) prior to the heating step. The heating step may be carried out using any suitable heating mechanism such as, for example, a heat gun or infrared heater. In some embodiments, the heating mechanism is placed under the laminate construction (e.g., adjacent to the backsheet). In some embodiments, the heating mechanism is placed above the laminate construction (e.g., adjacent to the light directing medium).

In some embodiments, the adhesive is a pressure-sensitive adhesive (PSA). Suitable types of PSAs include, but are not limited to, acrylates, silicones, polyisobutylenes, ureas, and combinations thereof. In some embodiments, the PSA is an acrylic or acrylate PSA. As used herein, the term "acrylic" or "acrylate" includes compounds having at least one of acrylic or methacrylic groups. Useful acrylic PSAs can be made, for example, by combining at least two different monomers (first and second monomers). Exemplary suitable first monomers include 2-methylbutyl acrylate, 2-ethylhexyl acrylate, isooctyl acrylate, lauryl acrylate, n-decyl acrylate, 4-methyl-2-pentyl acrylate, isoamyl acrylate, sec-butyl acrylate, and isononyl acrylate. Exemplary suitable second monomers include a (meth)acrylic acid (e.g., acrylic acid, methacrylic acid, itaconic acid, maleic acid, and fumaric acid), a (meth)acrylamide (e.g., acrylamide, methacrylamide, N-ethyl acrylamide, N-hydroxyethyl acrylamide, N-octyl acrylamide, N-t-butyl acrylamide, N,N-dimethyl acrylamide, N,Ndiethyl acrylamide, and N-ethyl-N-dihydroxyethyl acrylamide), a (meth)acrylate (e.g., 2-hydroxyethyl acrylate or methacrylate, cyclohexyl acrylate, t-butyl acrylate, or isobornyl acrylate), N-vinyl pyrrolidone, N-vinyl caprolactam, an alpha-olefin, a vinyl ether, an allyl ether, a styrenic monomer, or a maleate. Acrylic PSAs may also be made by including cross-linking agents in the formulation.

In some embodiments, the adhesive is selectively applied to the electrical connectors (bus bars or tabbing ribbons), with the width of the LRF strips being equal to or slightly larger than the width of the electrical connectors. Preferably, the adhesive is transparent. Desired transparency is at least 80% transparency to visible light. In some embodiments, the desired transparency is at least 90% to visible light. In other embodiments, the transparent adhesive is applied over the entire surface of the PV cells (e.g., flood coated). The LRF strips are then carefully positioned over, and in registration with, the electrical connectors. The entire structure is then heated to melt the adhesive and ensure adequate bonding of the light directing mediums to the electrical connectors.

Embodiments disclosed herein are directed to systems and methods of applying the narrow strips of material to one or more surfaces of a PV cell subassembly. The PV cell subassembly may comprise an individual PV cell or multiple PV cells which are arranged in a PV cell module. The narrow strips may comprise metal bus bar strips, tabbing ribbons, and/or LRF strips, for example. It can be challenging to produce and handle narrow strips of material formed by longitudinally cutting a wider stock of material into multiple strips and subsequently winding the narrower strips onto spools for storage. Embodiments disclosed herein are directed to systems and methods that involve longitudinal in-line cutting of a wider tape into multiple narrow strips and positioning the narrow strips during the manufacturing process. Using the approaches described herein, longitudinally cutting material into highly elongated, narrow strips that are wound onto spools for later use is not needed. Using the in-line cutting processes described herein, one spool of a wider tape can replace multiple narrow spools of material, reducing operating cost and material handling complexity.

Figure 3A:
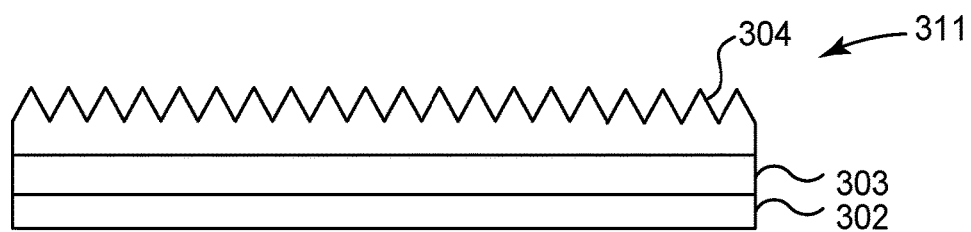
FIGS. 3A and 3B are cross sectional illustrations of tapes that may be employed by the systems and methods described herein.
Figure 3B:
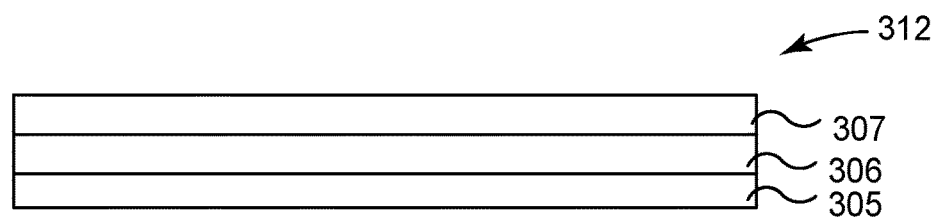

FIGS. 3A and 3B are cross sectional illustrations of tapes 311, 312 that may be employed by the systems and methods described herein. Tape 311 is a multilayer structure comprising LRF layer 304 having a structured surface. The LRF layer 304 is disposed on an adhesive layer 303 covered by a liner 302. Tape 312 is suitable for use to form bus bars and/or tabbing ribbons for PV cells. Tape 312 comprises a conductive, e.g., metal, layer 307 disposed on an adhesive layer 306 which may be covered by a liner 305.

Figure 3C:
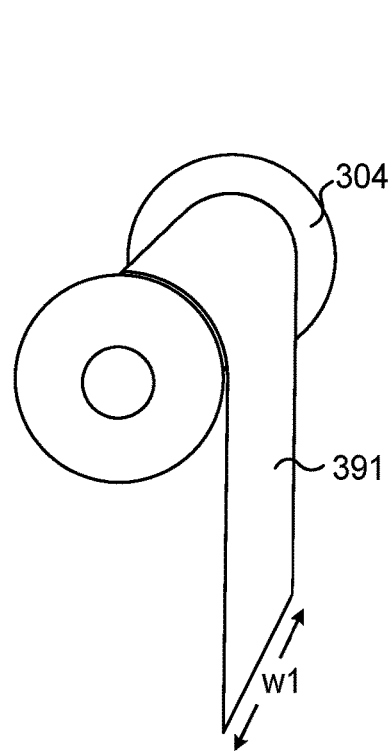
FIG. 3C illustrates a wider material which is referred to herein as a tape wound onto a roll.
Figure 3D:
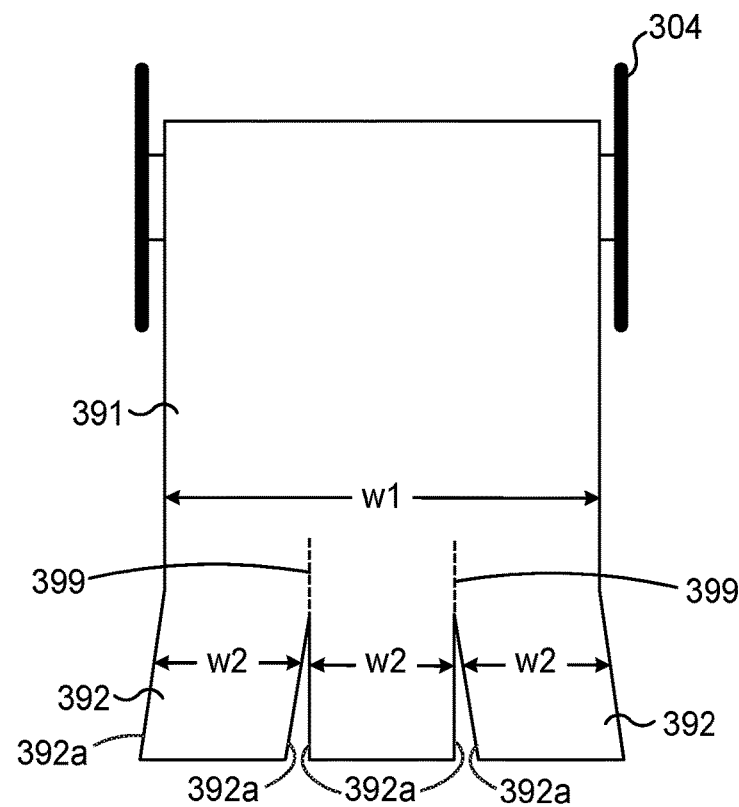
FIG. 3D shows the tape of FIG. 3C cut into three strips of equal width in accordance with some embodiments.

FIG. 3C illustrates a wider material 391 which is referred to herein as a tape wound onto an input roll 304. For example, the input roll 304 may comprise a level wound spool of tape. The tape 391 has a length l1 and a width w1, wherein l1>>w1. As disclosed herein, the tape 391 may be cut inline along cut line 399 to produce multiple strips 392 having width w2, wherein w1>w2 as shown in FIG. 3D. Alternatively, the tape 391 may be cut into multiple strips having different widths w2, w3, w4, where w2≠w3≠w4. Strips 392 have two elongated sides 392a that are substantially parallel.

Figure 3E:
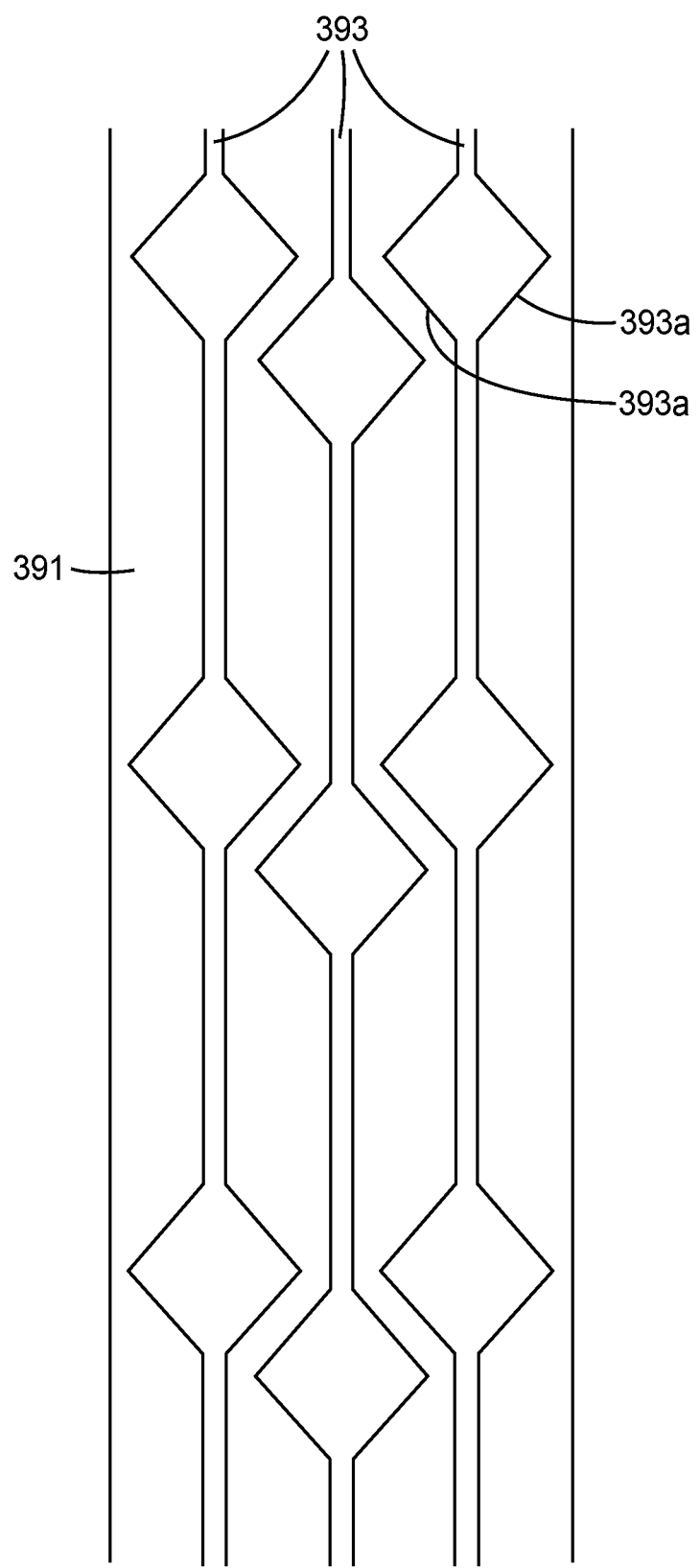
FIG. 3E shows the tape of FIG. 3C cut into an elongated geometrical shape for placement between PV cells of a PV cell module.

In some embodiments, the shapes cut inline by the system may be more complex geometrical shapes than the simple parallelogram shapes depicted by FIG. 3D. FIG. 3E shows multiple geometrical shapes 393 that may be cut from the wider tape 391. The shapes 393 are configured to fit between PV cells in the photovoltaically inactive spaces of a PV module (see feature 121 of FIG. 1C). FIG. 3E shows the tape 391 cut into three geometrical shapes that have substantially the same shape. Alternatively, the tape 391 may be cut into multiple strips having different geometrical shapes. Strips 393 include sections having elongated sides with portions 393a that are non-parallel.

Figure 4:
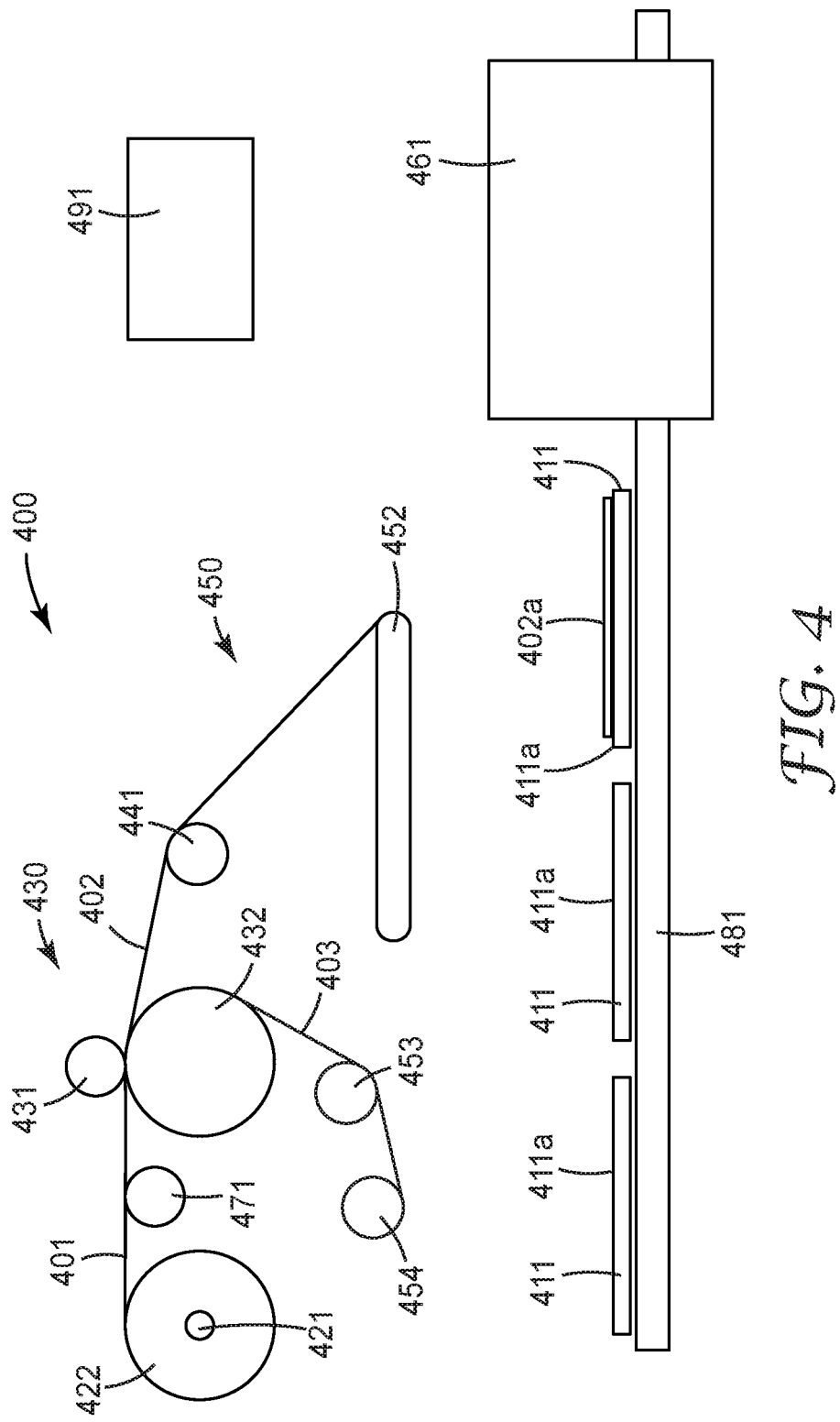
FIG. 4 is a block diagram that conceptually illustrates an automated system for applying strips to PV cell subassemblies in accordance with embodiments disclosed herein.

FIG. 4 is a block diagram that conceptually illustrates an automated system 400 for cutting and positioning strips relative to PV cell subassemblies in accordance with embodiments disclosed herein. The system 400 includes an input spindle 421 configured to hold an input roll 422 of tape 401 having width w1.

An in-line tape cutting mechanism 430 is configured to cut the tape 401 along its longitudinal axis into multiple strips 402 having width w2<w1. For example, the tape cutting mechanism 430 may comprise a rotary shear, crush cutter, or pinch cutter comprising a rotary die 431 and anvil 432 as shown in FIG. 4. In some implementations, the tape cutting mechanism 430 may comprise a laser cutting mechanism.

In some embodiments, the tape 401 and/or strips 402 may include a liner 403 that is removed before placement of the strips 402 onto the surface of the PV cell substrate 411a. For example, the liner 403 may be a protective film that protects an pressure sensitive adhesive disposed on the tape 401. FIG. 4 illustrates optional components 453, 454 configured to facilitate removal of the liner 403. In some embodiments, liner removal component 454 includes a vacuum system that applies a vacuum to remove the liner 403. In some embodiments a liner removal component 454 comprises a waste spindle that rolls up the liner 403 as it is removed from the tape 401. Optionally, the waste spindle may be driven by a motor to facilitate tensioning the tape 401 and/or strips 402. Alternatively or additionally, tensioning of the tape 401 and/or strips 402 may be accomplished using a tensioning dancer 453.

One or more guides 441 separate the multiple strips 402 and guide the multiple strips 402 into predefined spaced apart positions for placement on the PV cell subassemblies 411. In some configurations, the system 400 also includes one or more additional guides, such as a guide 471 that guides the tape 401 between the input spindle 421 and the tape cutting mechanism 430.

The system 400 is configured such that the multiple strips 402 remain attached to the tape 401 while the strips 402 are guided to the predefined spaced apart positions relative to the PV cell subassemblies 411. In some embodiments, the strips may be cut into shorter pieces after they are guided to the spaced apart positions but before they are placed on the PV cell subassembly at attachment locations. For example, bus bars may be cut to fit an individual PV cell prior to placement of the bus bars at the attachment locations on the PV cell.

The system includes a movement mechanism 450 configured to advance the tape 401 and move strips 402 through the manufacturing system 400. The movement mechanism 450 includes a strip positioner mechanism 452, such as a platen or other positioner mechanism configured to move the strips 402 in their spaced apart positions to attachment locations on the surfaces 411a of PV cell subassemblies 411. In some embodiments, the strips remain attached to the tape when the strips are placed at the attachment locations and/or attached to the attachment locations of the PV cell subassembly. The strip positioner 452 may be driven by a motor/belt system which advances the strips automatically for placement at the attachment locations. The strips may be in their spaced apart positions as the strip positioner 452 advances the strips. The movement mechanism may also include one or more motors coupled to rotate one or more of the input spindle 421 and/or anvil 432 to move the tape through the system 400.

The strips may be cut into shorter pieces before or after the strips are placed on the PV cell subassembly at the attachment locations. FIG. 4 shows a cut portion 402a of a strip 402 positioned at an attachment location on the surface 411a of a PV cell subassembly 411.

As illustrated in FIG. 4, the system 400 may include an optional attachment subsystem 461 that attaches the strips 402 to surfaces 411a of the PV cell subassemblies. For example, in some embodiments, the attachment subsystem 461 may comprise a soldering subsystem where the strips are soldered to the surfaces 411a of the PV cell subassemblies. For example, the strips may be electrically conductive metal film strips that are suitable for use as tabbing ribbons. In some embodiments, the strip positioner 452 may be configured to place and cut electrically conductive tabbing ribbons onto the substrate surfaces 411a. In some embodiments, the attachment subsystem 461 may be a soldering station that solders tabbing ribbons onto the bus bars of the PV cell subassemblies 411 after the tabbing ribbons are positioned at attachment locations on the surfaces 411a of the subassemblies 411.

In some embodiments, the strips 402 may be attached by an adhesive, e.g., an adhesive that is cured by heat, radiation, and/or ultrasonic energy. The adhesive may be a pressure sensitive adhesive. In these embodiments, the attachment subsystem 461 may be configured to expose the adhesive to one or more of heat, radiation, ultrasonic energy, pressure and/or other conditions to attach the strips 402 to the subassembly surfaces 411a. The use of a thermal and/or pressure sensitive adhesive is useful for attachment of polymeric films such as LRF to the substrate surface 411a or to attach electrically conductive strips to the surface 411a of the solar subassembly 411 using an electrically conductive pressure and/or temperature sensitive adhesive. In some embodiments, the system may not include a separate attachment subsystem. For example, in some embodiments, the strips may comprise LRF with a pressure sensitive adhesive layer. The LRF strips may be tacked onto the surface 411a by the strip positioner 452.

The system 400 may be part of an automated manufacturing system that includes a conveyer 481 configured to move the PV cell subassembly 411 through various stages of the manufacturing system 400. For example, the conveyer 481 may move the PV cell subassemblies 411 from a previous manufacturing stage to the stage where the strips 402 cut, positioned and/or attached. Subsequently, the conveyer may move the PV cell subassemblies to additional manufacturing stages. To facilitate automated operation, the system 400 includes a control system 491 configured to control one or more of the tape cutting mechanism 430, the guides 471, 441, the movement mechanism 450, the attachment subsystem 461, the conveyor 481, and/or other components of the automated system. In some embodiments, the control system receives inputs from various sensors arranged to sense operation of system components, e.g., tape position/tension sensors, environmental sensors (temperature and/or humidity sensors), strip position and/or tension sensors, etc. and provides output signals that control the operation of the system components based on the sensor inputs. According to some embodiments, during the guiding of the strips to their spaced apart positions, the tension of each strip 402 can be controlled to within about 10 to about 500 g/mm of width of the strip. In some implementations, the guides 471, 441 enable guiding each strip 402 to its spaced apart position and/or placement of the strip 402 at the attachment location with precision of about 0.1 to about 0.2 mm. According to some embodiments, the control system 491 includes a processor implementing programmed instructions to control operation of the various components. The control system may be configured to control one or more of movement of the tape, cutting the strips, tensioning the strips, placement of the strips, and attachment of the strips, for example.

Figure 5:
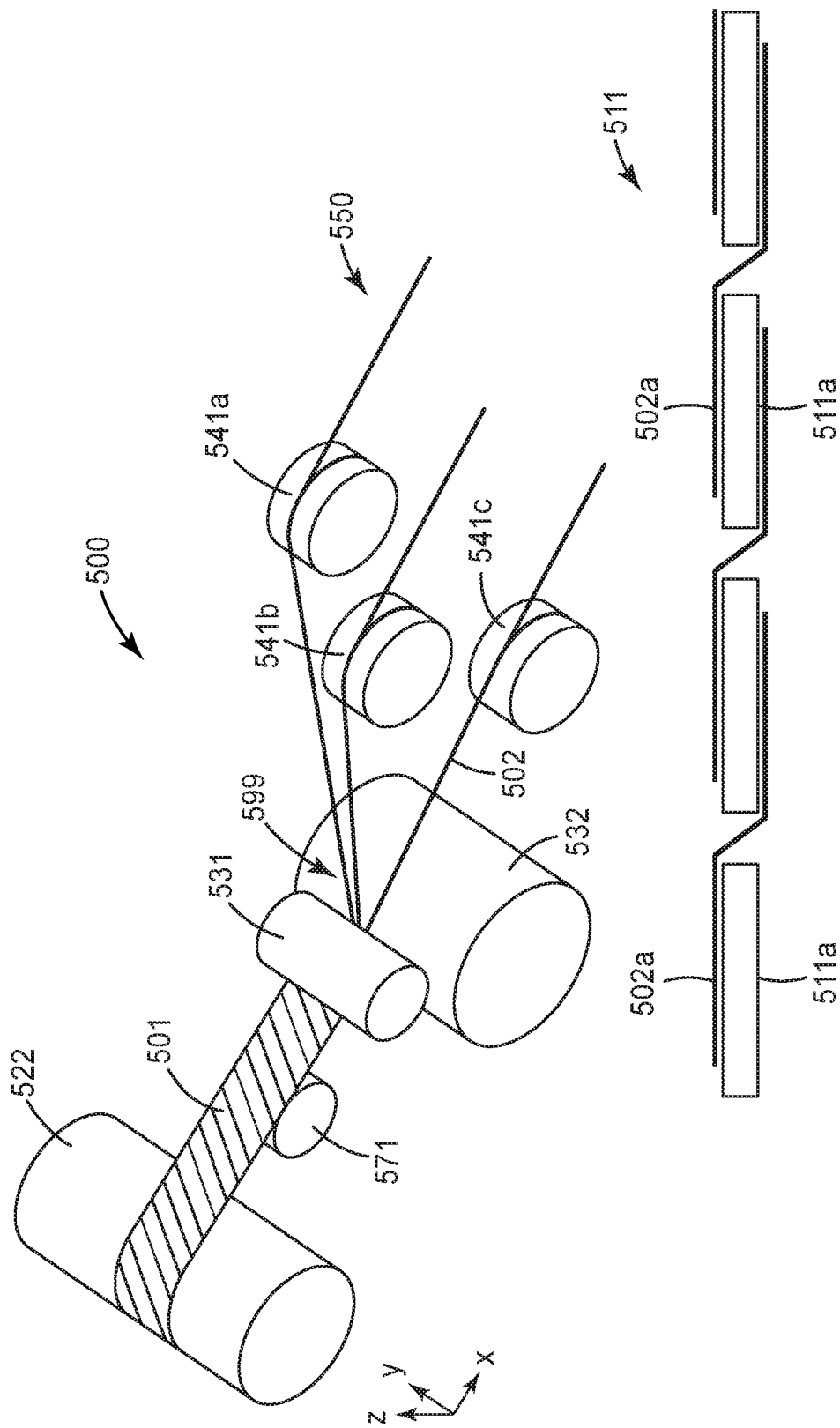
FIG. 5 is a perspective view of a portion of a PV cell subassembly manufacturing system in accordance with some embodiments.

FIG. 5 is a perspective view of a portion of a PV cell subassembly manufacturing system 500 in accordance with some embodiments. FIG. 5 depicts a level-wound spool of tape 501 having three times the width of the strips 502 that are applied to the PV cell subassembly 511. In some embodiments a non-level wound spool may be used. A precision guide 571 guides the tape 501 to a crush cutting, shear cutting, or other type of cutting mechanism. In a crush cutting implementation, the tape 501 travels between a rotary die 531 and rotary anvil 532 that rotate around the y axis to cut the tape 530 into tree by crush cutting between the die 531 and anvil 532. In the illustrated implementation, the tape cutting mechanism 531, 532 cuts the tape into three strips 502 of equal width. It will be understood that the number of strips produced from the tape may be greater or fewer than three and will depend on the particular application.

The three strips 502 are separated as they emerge from the tape cutting mechanism 531, 532 indicated as location 599 in FIG. 5. The strips 502 are guided by separate precision guides 541a,b,c to spaced apart positions (indicated by arrow 550) prior to placement at an attachment location on the surface of the PV cell subassembly 511. FIG. 5 shows the PV cell subassembly 511 comprising multiple PV cells 511a. In some implementations, the strips are electrically conductive, e.g., metallic strips, and the PV cells 511a are electrically connected by sections of the strips 502a that function as tabbing ribbons. In some embodiments, the strips may comprise an LRF film that is positioned on top of the tabbing ribbons 502a. In some embodiments, the strips may comprise bus bars of the PV cells 511a as previously discussed in connection with FIGS. 3A and 3B.

Figure 6:
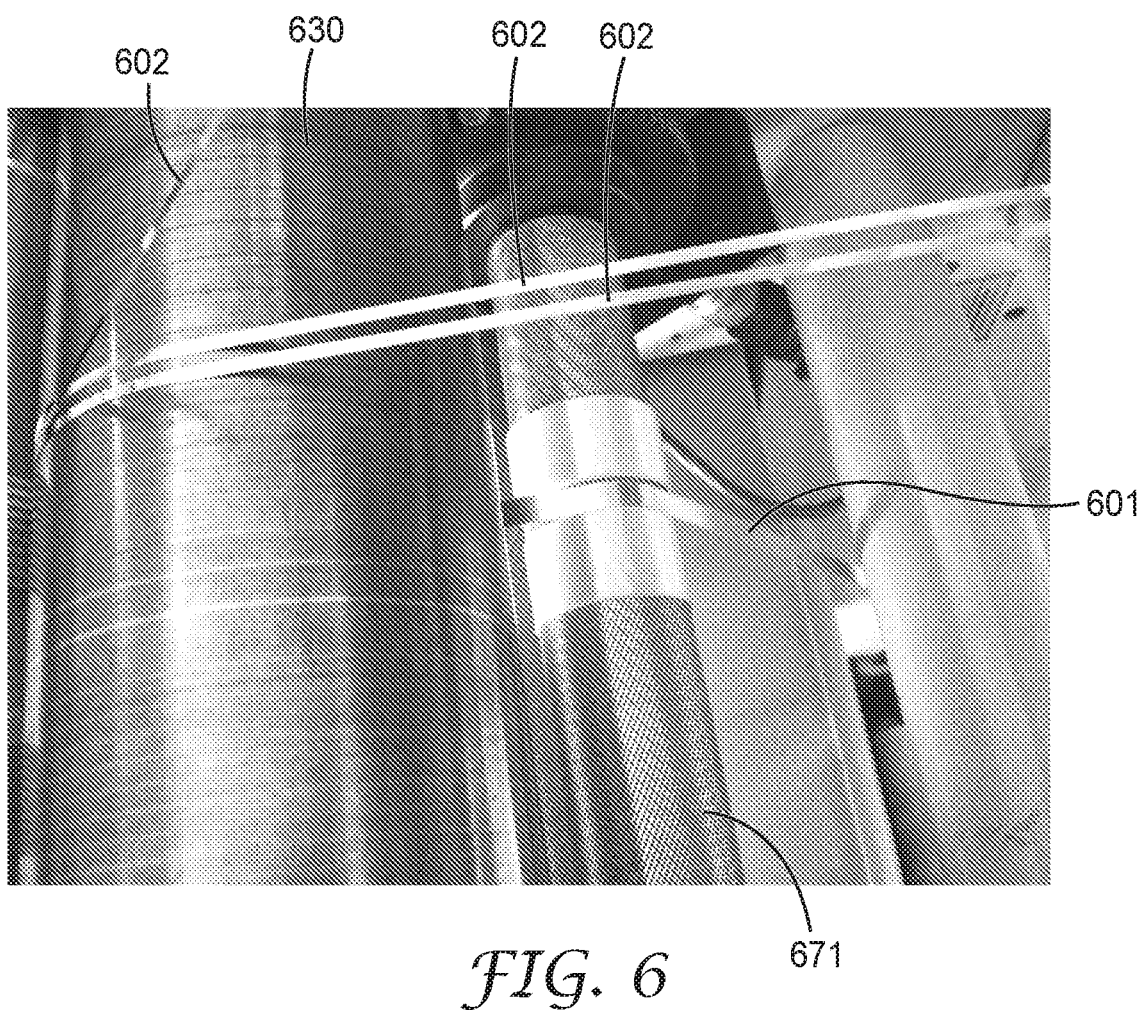
FIG. 6 is a photograph showing a close up view of the separation of the three strips after the input tape is slit by the tape cutting mechanism according to some embodiments.

FIG. 6 is a photograph showing a close up view of the separation of the three strips 602 after the input tape 601 is cut by the tape cutting mechanism 630. FIG. 6 also provides a view of the precision guide 671 that guides the tape 601 to the cutting mechanism 630.

Figure 7:
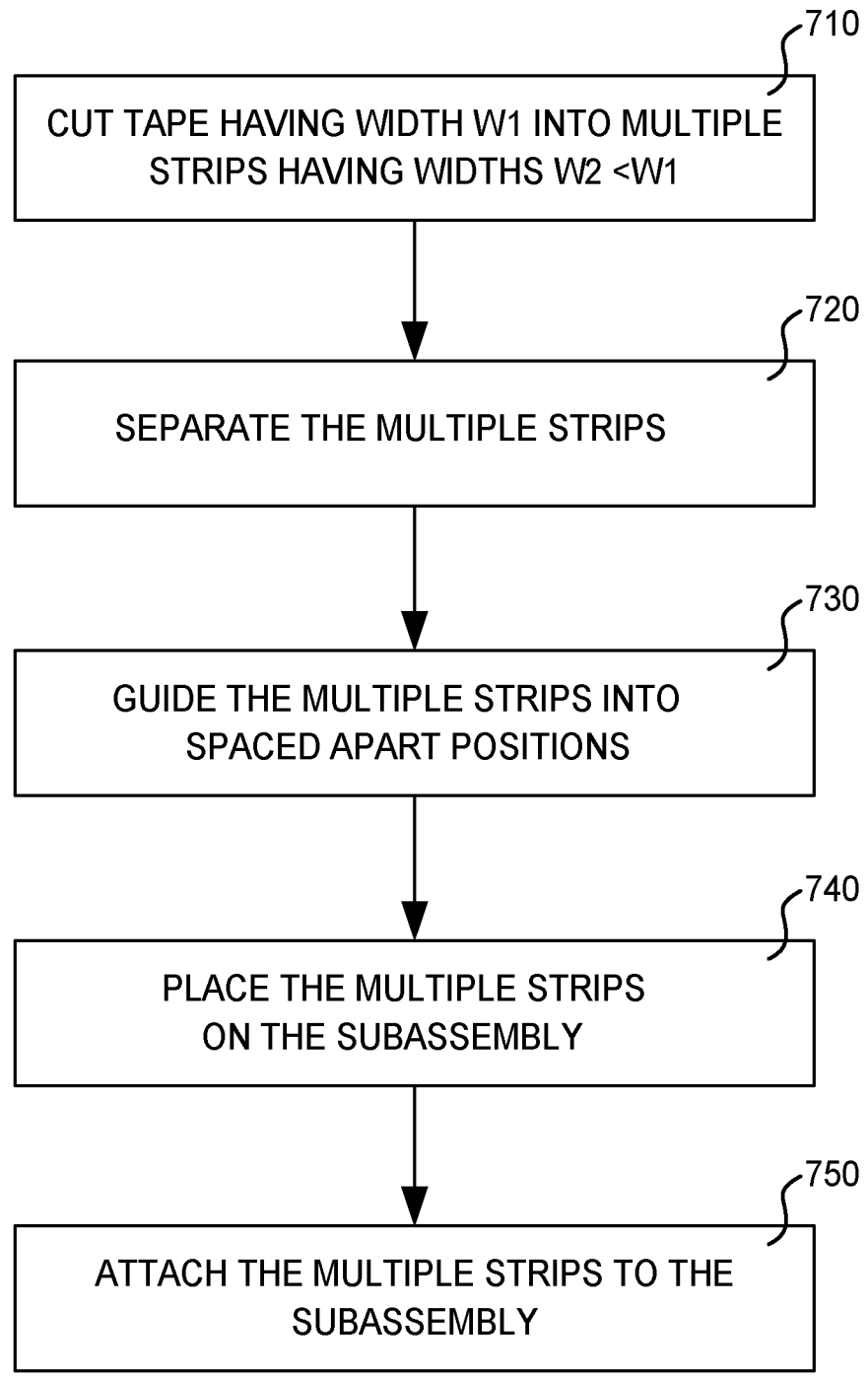
FIG. 7 is a flow diagram that describes an automated method of making PV cell subassemblies in accordance with some embodiments.

FIG. 7 is a flow diagram that describes an automated method of making PV cell subassemblies in accordance with some embodiments. The method includes cutting 710 a tape having width w1 into multiple strips having width w2<w1. For example, the tape can be slit into a number of strips, e.g., three strips, having substantially equal widths without further trimming edges of the tape prior to placement on the PV cell subassembly.

The strips are physically separated 720 and are guided 730 into spaced apart positions relative to a surface of the PV cell subassembly comprising one or more PV cells. The multiple strips remain attached to the tape while the strips are guided to the spaced apart positions. The thickness of the tape may be less than about 300 μm, less than about 150 μm, less than about 100 μm, or even less than about 50 μm. The strips are placed 740 on the surface of the PV cell subassembly at attachment locations and are attached 750 to the PV cell subassembly. The tape and strips can be a metallic film that is attached to the PV cell subassembly as bus bars or tabbing ribbons. In yet other embodiments, the tape comprises a polymeric light redirecting layer that is placed on a tabbing ribbon layer, between PV cells of a PV cell module, at the edge of the PV cell module, and/or at other locations of the PV cell subassembly.

The system and method involve inline cutting a tape into multiple strips and guiding the strips to spaced apart positions while the strips remain attached to the tape. In some embodiments, while at their spaced apart positions, the strips may be separated by a distance of at least 0.5 mm, 1 mm, 2 mm, 3 mm or more than 3 mm but less than about 20 mm or less than about 10 mm, for example. After they are guided to the spaced apart positions, the strips may be positioned at attachment locations on one or more of various surfaces and/or structures of a PV cell subassembly. In various embodiments, the strips may be placed on one or more of an encapsulant layer, a glass layer and a backsheet layer of the PV cell subassemblies. In some embodiments, the strips may be placed and attached between PV cells of a module or at the edges of the PV cell module or at other locations of the PV cell subassembly.

The strips can be attached to the PV cell subassemblies using a pressure sensitive or thermally activated adhesive. As previously discussed, the tape and/or strips may include a protective liner that is removed prior to guiding the strips to the spaced apart positions. If the strips are electrically conductive, e.g., metallic bus bars or tabbing ribbons, the strips may be soldered to the subassemblies or attached to the subassemblies using a conductive adhesive. If the strips are LRF, the strips may be attached to the subassemblies using a non-conductive pressure sensitive adhesive.

The approaches for in-line cutting and positioning have been described herein in terms of PV cell solar subassemblies. However, it will be appreciated that these approaches may also be applied to any type of subassemblies that involve the application of strips of material to a surface of a substrate.

Items disclosed herein include:

Item 1. An automated photovoltaic (PV) subassembly manufacturing method comprising:
  cutting a tape longitudinally into multiple strips;
  separating the multiple strips;
  guiding the multiple strips into spaced apart positions relative to a surface of the PV cell subassembly comprising one or more PV cells, the multiple strips remaining attached to the tape while the strips are guided to the spaced apart positions; and positioning the multiple strips at attachment locations on the surface of the PV cell subassembly.

Item 2. The method of item 1, wherein the multiple strips remain attached to the tape while the strips are positioned at the attachment locations.

Item 3. The method of item 2, further comprising attaching the strips to the surface of the PV cell subassembly at the attachment locations.

Item 4. The method of item 3, wherein the multiple strips remain attached to the tape while the multiple strips are attached to the PV cell subassembly.

Item 5. The method of any of items 1 through 3, wherein the tape comprises a polymeric film or a metallic tape.

Item 6. The method of any of items 1 through 4, wherein the tape comprises an adhesive layer.

Item 7. The method of item 6, wherein the adhesive layer is a pressure sensitive adhesive layer.

Item 8. The method of item 7, further comprising removing a liner from the tape or from the multiple strips.

Item 9. The method of any of items 1 through 8, wherein the width of the tape is at least three times a width each strip.

Item 10. The method of any of items 1 through 9, wherein a width of each strip is less than 3 mm.

Item 11. The method of any of items 1 through 10, wherein a thickness of the tape is between about 10 μm and about 300 μm.

Item 12. The method of any of items 1 through 11, further comprising controlling tension of each strip during the guiding to within about 10 to about 500 g/mm of width of the strip.

Item 13. The method of any of items 1 through 12, wherein guiding the multiple strips comprises guiding each strip to its spaced apart position with precision of about 0.1 to about 0.2 mm.

Item 14. The method of any of items 1 through 13, wherein cutting the tape comprises cutting multiple strips of equal width.

Item 15. The method of any of items 1 through 13, wherein cutting the tape comprises cutting multiple strips of unequal width.

Item 16. The method of any of items 1 through 15, wherein cutting the tape comprises cutting the tape without trimming edges of the tape.

Item 17. The method of any of items 1 through 16, wherein positioning the multiple strips comprises positioning at least one of bus bars, tabbing ribbons, and light redirecting film.

Item 18. The method of any of items 1 through 17, wherein the multiple strips have elongated sides that are substantially parallel to each another.

Item 19. The method of any of items 1 through 17, wherein the multiple strips have elongated sides in which portions are not parallel to each other.

Item 20. The method of any of items 1 through 19, wherein positioning the multiple strips comprises positioning the multiple strips at photovoltaically inactive areas of the PV cell subassembly.

Item 21. The method of any of items 1 through 20, wherein positioning the multiple strips comprises positioning the multiple strips between PV cells of a PV cell module.

Item 22. The method of claim any of items 1 through 20, wherein positioning the multiple strips comprises positioning the multiple strips at edges of a PV cell module.

Item 23. An automated photovoltaic cell subassembly manufacturing system comprising:
  an input spindle configured to hold an input roll of tape;
  a tape cutting mechanism configured to longitudinally cut the tape into multiple strips; and
  one or more guides configured to separate and guide the multiple strips into spaced apart positions for placement on the photovoltaic (PV) cell subassembly at attachment locations, the system configured such that the multiple strips remain attached to the tape while the strips are guided to the spaced apart positions.

Item 24. The system of item 23, further comprising a guide configured to guide the tape between the input spindle and the tape cutting mechanism.

Item 25. The system of any of items 23 through 24, wherein the input roll is a level wound spool.

Item 26. The system of any of items 23 through 24, wherein the input roll is a non-level wound spool Item 27. The system of any of items 23 through 26, wherein the tape cutting mechanism comprises a rotary die.

Item 28. The system of any of items 23 through 26, wherein the tape cutting mechanism comprises a laser cutting mechanism.

Item 29. The system of any of items 23 through 29, wherein the tape cutting mechanism is configured to cut multiple strips of equal width.

Item 30. The system of any of items 23 through 29, wherein the tape cutting mechanism is configured to cut multiple strips of unequal width.

Item 31. The system of any of items 23 through 30, wherein the tape cutting mechanism is configured to cut multiple strips having elongated sides that are substantially parallel to each other.

Item 32. The system of any of items 23 through 30, wherein the tape cutting mechanism is configured to cut strips having elongated sides wherein portions of the elongated sides are non-parallel to each other.

Item 33. The system of any of items 23 through 32, further comprising a strip positioning mechanism configured to position the multiple strips at the attachment locations.

Item 34. The system of item 33, wherein the multiple strips remain attached to the tape after the multiple strips are at the attachment locations of the PV cell subassembly.

Item 35. The system of item 34, wherein the multiple strips remain attached to the tape after the multiple strips are attached to the PV cell subassembly.

Item 36. The system of any of items 23 through 35, wherein the attachment locations are over tabbing ribbons of the PV cell subassembly.

Item 37. The system of any of items 23 through 35, wherein the attachment locations are over inactive portions of the PV cell subassembly.

Item 38. The system of any of items 23 through 37, further comprising an attachment system configured to apply one or more of heat, pressure, radiation, and ultrasonic energy to the multiple strips.

Item 39. The system of any of items 23 through 38, further comprising a tensioning mechanism that controls tension each strips to within about 10 to about 500 g/mm of width of the strip.

Item 40. The system of any of items 23 through 39, further comprising a control system configured to control one or more of advancing the tape, cutting the multiple strips, tensioning the multiple strips, guiding the multiple strips to the spaced apart positions, positioning the multiple strips at the attachment locations, and attaching the multiple strips.

Item 41. An automated photovoltaic cell subassembly manufacturing system comprising:
    an input spindle configured to hold an input roll of tape;
    a tape cutting mechanism configured to cut the tape into multiple strips; and
    one or more guides configured to separate and guide the multiple strips into spaced apart positions for placement at attachment locations on the photovoltaic (PV) cell subassembly, the system configured such that the multiple strips remain attached to the tape while the strips are guided to the spaced apart positions, wherein each strip is guided to its spaced apart position with precision of about 0.1 mm to about 0.2 mm.

Item 42. The system of item 41, wherein a thickness of the tape is between about 10 µm to about 300 µm.

Item 43. The system of any of items 41 through 42, wherein a width of each strip is less than about 3 mm.

Item 44. The system of any of items 41 through 43, further comprising a tensioning mechanism configured to control tension of each strips as it is being guided to within about 10 to about 500 g/mm of width of the strip.

Item 45. An automated manufacturing method comprising:
    cutting a tape longitudinally into multiple strips;
    separating the multiple strips;
    guiding the multiple strips into spaced apart positions relative to a surface of a substrate, the multiple strips remaining attached to the tape while the strips are guided to the spaced apart positions; and
    positioning the multiple strips at attachment locations on the surface of the substrate.

Item 46. The method of item 45, wherein the multiple strips remains attached to the tape while the strips are positioned at the attachment locations.

Item 47. The method of item 46, further comprising attaching the strips to the surface of the substrate at the attachment locations.

Item 48. The method of item 47, wherein the multiple strips remain attached to the tape after the multiple strips are attached to the substrate.

Item 49. The method of any of items 45 through 48, further comprising removing a liner from the tape or from the multiple strips.

Item 50. The method of any of items 45 through 49, wherein a width of the tape is at least three times a width of each strip.

Item 51. The method of any of items 45 through 50, wherein a width of each strip is less than 3 mm.

Item 52. The method of any of items 45 through 51, wherein a thickness of the tape is between about 10 µm and about 300 µm;

Item 53. The method of any of items 45 through 52, further comprising controlling tension of each strip during the guiding to within about 10 to about 500 g/mm of width of the strip.

Item 54. The method of any of items 45 through 52, wherein guiding the strips comprises guiding each to its spaced apart position with precision of about 0.1 to about 0.2 mm.

Item 55. An automated manufacturing system comprising:
    an input spindle configured to hold an input roll of tape;
    a tape cutting mechanism configured to longitudinally cut the tape into multiple strips; and
    one or more guides configured to separate and guide the multiple strips into spaced apart positions for placement at attachment locations on a surface of substrate, the system configured such that the multiple strips remain attached to the tape while the strips are guided to the spaced apart positions.

Item 56. The system of item 55, further comprising a strip positioning mechanism configured to position the multiple strips at the attachment locations.

Item 57. The system of item 56, wherein the multiple strips remain attached to the tape when the multiple strips are at the attachment locations of the substrate.

Item 58. The system of item 57, wherein the multiple strips remain attached to the tape after the multiple strips are attached to the substrate.

Item 59. The system of any of items 55 through 58, wherein the guides are configured to guide each strip to its spaced apart position with precision of about 0.1 to about 0.2 mm.

Item 60. The system of any of items 55 through 59, further comprising a tensioning mechanism that controls tension of each to within about 10 to about 500 g/mm of width of the strip.

Item 61. The system of any of items 55 through 60, further comprising a control system configured to control one or more of advancing the tape, cutting the multiple strips, tensioning the multiple strips, guiding the multiple strips to the spaced apart positions, positioning the multiple strips at the attachments locations, and attaching the multiple strips.

Various modifications and alterations of these embodiments will be apparent to those skilled in the art and it should be understood that this scope of this disclosure is not limited to the illustrative embodiments set forth herein. For example, the reader should assume that features of one disclosed embodiment can also be applied to all other disclosed embodiments unless otherwise indicated.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

It is to be understood that even though numerous characteristics of various embodiments have been set forth in the foregoing description, together with details of the structure and function of various embodiments, this detailed description is illustrative only, and changes may be made in detail, especially in matters of structure and arrangements of parts illustrated by the various embodiments to the full extent indicated by the broad general meaning of the terms in which the appended claims are expressed.

The invention claimed is:

1. An automated photovoltaic (PV) subassembly manufacturing method comprising:
    cutting a tape longitudinally into multiple strips;
    separating the multiple strips;
    guiding the multiple strips into spaced apart positions relative to a surface of a PV cell subassembly comprising one or more PV cells, the multiple strips remaining attached to the tape while the strips are guided to the spaced apart positions; and
    positioning the multiple strips at attachment locations on the surface of the PV cell subassembly.

2. The method of claim 1, wherein the tape comprises a polymeric film or a metallic tape.

3. The method of claim 1, wherein the tape comprises an adhesive layer.

4. The method of claim 3, wherein the adhesive layer is a pressure sensitive adhesive layer.

5. The method of claim 4, further comprising removing a liner from the tape or from the multiple strips.

6. The method of claim 1, wherein a width of the tape is at least three times a width of each strip.

7. The method of claim 1, wherein a width of each strip is less than 3 mm.

8. The method of claim 1, wherein the cutting the tape comprises cutting multiple strips of equal width.

* * * * *